(12) United States Patent
Green et al.

(10) Patent No.: US 7,700,923 B2
(45) Date of Patent: Apr. 20, 2010

(54) APPARATUS OF PHOTOCONDUCTOR CRYSTAL GROWTH

(75) Inventors: Michael C. Green, Palo Alto, CA (US); Robert M. Sutherland, Menlo Park, CA (US)

(73) Assignee: Varian Medical Systems, Inc., Palo Alto, CA (US)

( * ) Notice: Subject to any disclaimer, the term of this patent is extended or adjusted under 35 U.S.C. 154(b) by 0 days.

(21) Appl. No.: 12/234,647

(22) Filed: Sep. 20, 2008

(65) Prior Publication Data

US 2010/0072382 A1 Mar. 25, 2010

(51) Int. Cl.
*G01T 1/24* (2006.01)
(52) U.S. Cl. ................... 250/370.09; 438/1
(58) Field of Classification Search ............ 438/1; 250/370.09
See application file for complete search history.

(56) References Cited

U.S. PATENT DOCUMENTS 6,730,537 B2 * 5/2004 Hutchison et al. ............ 438/99
2003/0185870 A1 10/2003 Grinstaff et al.
2006/0052947 A1 * 3/2006 Hu ............................... 702/20
2007/0104758 A1 * 5/2007 Hamilton et al. ............ 424/423

OTHER PUBLICATIONS

D. B. Burckel, Hongyou Fan, G. Thaler, and D. D. Koleske, "Lithographically defined carbon growth templates for ELOG of GaN." Journal of Crystal Growth, vol. 310 (2008), pp. 3113-3116. Available online Mar. 18, 2008. <doi:10.1016/j.jcrysgro.2008.03.023>.*
Lee et al., "Ordering of quantum dots using genetically engineered viruses," Science, 2002, 296, pp. 892-895.
Mao et al., "Viral assembly of oriented quantum dot nanowires," PNAS, 2003, 100(12), pp. 6946-6951.
Mao et al., "Viral-based toolkit for the directed synthesis of magnetic and semiconducting nanowires," Science, 2004, 303, pp. 213-217.
Reiss et al., "Biological routes to ferromatic metal alloy nanostructures," Nano Letters, 2004, 4, pp. 1127-1132.
Sweeney et al., "Bacterial biosynthesis of cadmium sulfide nanocrystals," Chemistry & Biology, 2004, 11, pp. 1553-1559.

* cited by examiner

*Primary Examiner*—Constantine Hannaher
(74) *Attorney, Agent, or Firm*—Houst Consulting

(57) ABSTRACT

An image acquisition device having a photoconductor, a substrate including a detector array and an interlayer between the photoconductor and the substrate is disclosed. The interlayer is formed of molecules having a first ligand selectively binding the substrate and a second ligand selectively binding the photoconductor.

38 Claims, 7 Drawing Sheets

APPARATUS OF PHOTOCONDUCTOR CRYSTAL GROWTH

BACKGROUND

This application relates generally to photoconductor crystal growth, and in particular to image acquisition devise and x-ray detectors.

Digital x-ray imagers are progressively replacing films in many medical and scientific applications. These imagers generally use a pixelated array of thin film transistor (TFT) switches fabricated from amorphous silicon (a-Si) deposited on a flat glass substrate. The switches define addressable pixels. At each pixel, there is a photodiode and a capacitor connected to the TFT. A layer of scintillator material covers the array of photodiodes. The scintillator is typically a compound such as gadolinium oxysulphide or cesium iodide that emits light when it absorbs x-ray photons. When x-ray photons enter the scintillator layer, they are absorbed and visible light is emitted. A proportion of the emitted light illuminates the photodiode located at the pixel beneath the point where the x-ray photons are absorbed. The light causes current to flow through the photodiode, which deposits charge in the capacitor. For readout the TFTs are switched on in sequence via gate lines, and the integrated charge collected on each capacitor is read out via orthogonal data lines to an ND converter. The amount of charge collected per pixel is proportional to the local x-ray flux absorbed in the scintillator, and the digitized values of charge per pixel form a digital image of the spatial distribution of x-ray flux incident onto the detector.

Conventional x-ray detectors employ indirect detection of x-ray photons. The energy of the photons is first converted into visible light and the visible light photons subsequently illuminate a photodiode, resulting in the collection of electric charge. In conventional x-ray detectors, some optical photons never reach the photodiodes beneath the scintillator layer and their energy is lost, which reduces the sensitivity of the imager to x-rays. Some photons are emitted in directions such that they illuminate nearby photodiodes rather than the photodiode at the pixel where the x-ray photons are absorbed. This causes loss of image resolution.

SUMMARY

In an illustrated embodiment, an image acquisition device comprises a photoconductor, a substrate having a surface, a detector array deposited on the surface of the substrate, and an interlayer between the photoconductor and the substrate, wherein the interlayer is formed of molecules having a first ligand and a second ligand.

In another illustrated embodiment, an image acquisition device comprises a photoconductor formed of a crystallographic semiconductive material capable of converting photons to electrons and holes, a substrate formed of a non-biomaterial and a detector array, and an interlayer between the photoconductor and the substrate, wherein the interlayer is formed of molecules having a first ligand and a second ligand.

In another embodiment, a structure comprises a substrate formed of a first non-biomaterial, and a layer formed of molecules having a first ligand selectively binding the substrate, a second ligand selectively binding a second non-biomaterial, and a linker linking the first ligand and the second ligand.

In yet another embodiment, a structure comprises a substrate layer formed of a first material, and a template layer above the substrate layer formed of template molecules for ordered inorganic crystal growth.

BRIEF DESCRIPTION OF THE DRAWINGS

These and various other features and advantages of the present application will become better understood upon reading of the following detailed description in conjunction with the accompanying drawings and the appended claims provided below, where:

DETAILED DESCRIPTION

Various embodiments of the present application are described hereinafter with reference to the figures. It should be noted that the figures are only intended to facilitate the description of specific embodiments of the application. They are not intended as an exhaustive description of this application or as a limitation on its scope. In addition, an aspect described in conjunction with a particular embodiment of the present application is not necessarily limited to that embodiment and can be practiced in any other embodiments. For instance, the present application describes various embodiments of an x-ray detector. It will be appreciated that the present application can also be applied to solar cells, semiconductors, superconductors, hard coatings, heterogeneous catalysts, electrochemistry, or high performance batteries etc.

The present application generally describes a structure of ordered inorganic crystal. A structure comprises a substrate layer formed of a first material, a template layer atop of the substrate formed of template molecules for ordered inorganic crystal growth, and a layer of inorganic crystal atop of the template layer. It should be appreciated by one skilled in the art that the relative positions of the components of the structure of ordered inorganic crystal are not absolute but interchangeable. The template molecule comprises a first ligand selectively binding the substrate, a second ligand selectively binding a second material, and a linker linking the first ligand and the second ligand. The template molecule may comprise proteins, polypeptides, poly peptide-analogs, chemical moieties, and any combination thereof. The second material is an inorganic crystal and the second ligand selectively binds a specific face of the crystallographic structure of the inorganic crystal.

Figure 1:
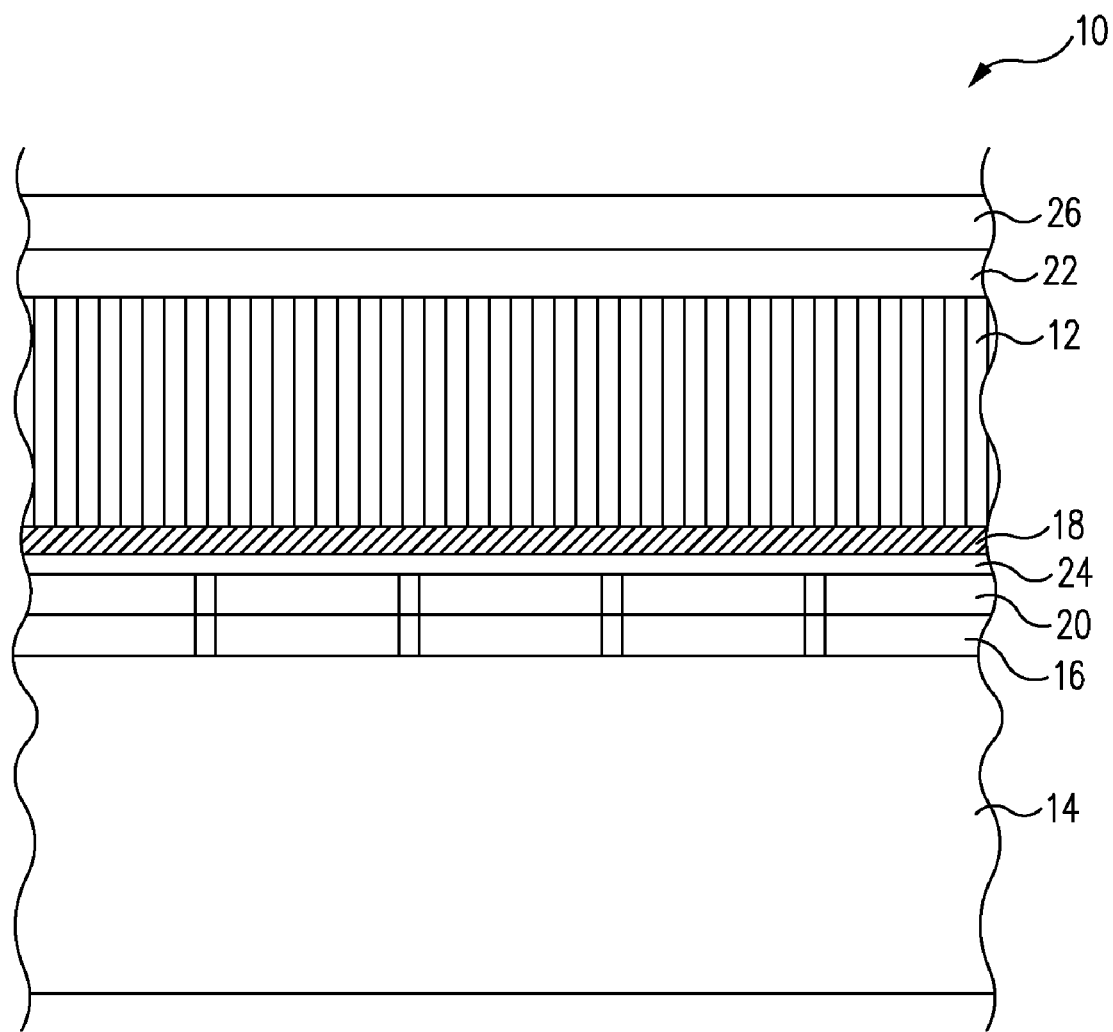
FIG. 1 schematically illustrates an exemplary x-ray detector in accordance with one embodiment of the application.

The structure of inorganic crystal may be applicable to comprise an x-ray detector. FIG. 1 schematically illustrates an exemplary x-ray detector 10 in accordance with one embodiment of the application. Generally, the x-ray detector 10 includes a substrate 14 having a surface, a detector array 16 deposited on the surface of the substrate, a photoconductor 12 and an interlayer 18 between the photoconductor 12 and the substrate 14. First and second electrodes 20, 22 are provided to create an electric field for transporting electric signals through the photoconductor 12. A protective film such as a Parylene film 26 can optionally be used to encapsulate the structure of the x-ray detector 10 for environmental protection. In one embodiment, the substrate 14 and detector array 16 may be overlaid by the first electrode 20, which may be further overlaid optionally by a barrier layer 24. The optional barrier layer 24 may be overlaid by the interlayer 18, which is overlaid by the photoconductor 12, with the second electrode 22 atop of the photoconductor 12 and a protective film 26 atop of the second electrode. The relative positions of the components of the x-ray detector 10 (i.e., atop, overlaid) are described herein in connection with the Figures but do not connote any absolute orientation and may otherwise be interchangeable. Optionally, additional components or layers may be inserted between the components or layers of the illustrated embodiments of x-ray detector 10, layers or components described in conjunction with a given embodiment may be used in addition to or in place of one or more layers or components of other embodiments illustrated herein, and embodiments of the invention may include only some of the layers or components of the embodiments illustrated herein. Accordingly, for example, as used herein when a layer or component is described as being disposed or deposited above or on another layer or component, there may optionally be one or more layers or components between the described layers or components.

The substrate 14 can be made from a wide variety of materials. It can be elemental and/or compound substrate. It can be flexible or rigid. In some embodiments, the substrate 14 is made of non-biomaterials. As used herein, non-biomaterial refers to a material that is not a component of a living system. Exemplary materials suitable for the substrate include, but are not limited to, silicon, quartz, ceramics, glass, plastics such as Kapton, metals such as aluminum, copper, molybdenum, tungsten, and alloys such as chrome, steel, gallium arsenide, indium phosphide, metal oxides and/or nitrides. As used herein, substrate may mean the base material (e.g., glass) on which other layers are deposited and processed, or may mean such material having other layers, structures, or substances disposed or integrated on such base material at a given point in the processing.

Detector array 16 includes a plurality of detector elements and may be formed above the substrate 14. While the structural components of the detector elements are not shown in detail in FIG. 1 to avoid obscuring illustration of various embodiments of the application, each detector element may have a storage capacitor to store the charge generated by the x-rays and collected by first electrode 20. Each detector element may also include a switching element such as a thin film transistor (TFT) to access the collected charges by readout electronics. The TFTs and capacitors can be formed on substrate 14 by any methods known in the art. Typically, an a-Si TFT includes spaced apart source and drain electrodes on an amorphous silicon layer, and a gate electrode on a dielectric layer. The TFTs can be amorphous silicon (a-Si) TFT, or crystalline or polycrystalline silicon TFT. It should be pointed out that other switching elements such as organic transistors, coupled charge devices (CODs), and/or switching diodes can also be used. Each detector element forms a pixel of the X-ray image generated using the detector array. The detector array also includes a pixel access circuit (not shown) coupled to detector elements. The pixel access circuit accesses the detector elements and reads the electric signals from the detectors. The process of accessing detector elements and reading electric signals therefrom is known to those skilled in the art.

The first electrode 20 may be formed atop the detector array 16. In one embodiment, the first electrode 20 is pixellated and includes a plurality of pixel units. The pixel units may be aligned with the detector elements in the detector array 16. In one embodiment, each pixel unit is aligned with one detector element in the detector array 16. In such embodiment, the size of the pixel units is about the same as that of the detector element.

The first electrode 20 can be made from any suitable materials, such as silver, chromium, aluminum, gold, nickel, vanadium, zinc, palladium, platinum, carbon, etc, and alloys of these materials. Semiconductive layers such as cuprous iodide, indium tin oxide (ITO), cadmium stannate, silicon, germanium, amorphous silicon and doped versions of these semiconductors may also be used. In general, materials that are capable of conducting electrical current are suitable for construction of the first electrode 20. The first electrode 20 may have a variety of configurations and shapes.

The optional barrier layer 24 may be formed atop the first electrode 20 and the detector array 16. The barrier layer 24 may be a chemical barrier layer such as an impervious polymer film. One of the functions of the barrier layer 24 is to prevent interaction between photoconductor 12 and gate and data lines such as aluminum lines within the TFT array. Although aluminum lines are generally protected beneath layers of dielectric and first electrode 20 in the TFT structure, pinholes may be present in the structure which can result in a corrosive reaction of the photoconductor 12 with the aluminum lines, which destroys the conductivity of gate and data lines. Another function of barrier layer 24 is to planarize the surface of the TFT array.

In some embodiments, the barrier layer 24 may be an electrical insulator that is embedded with particles of electrically conducting materials. The conducting particles preferably have diameters comparable to the thickness of the barrier layer 24 such as equal to or slightly larger than the thickness of the barrier layer. The conducting particles are dispersed in the barrier layer 24 at a density low enough to prevent percolative conduction from particle to particle. In one embodiment, a 2-25 percent by weight of conducting particles can be embedded in an electrical insulator. In another embodiment, a 4-15 percent by weight of conducting particles can be embedded in an electrical insulator. Thus, the conducting particles provide a low impedance path for charge transport vertically through the thickness of the barrier layer 24, which prevents polarization effects. On the other hand, the conducting particles are spaced apart sufficiently that they do not give rise to lateral electrical conductivity in the plane of the barrier layer 24, which could otherwise cause short circuits between adjacent pixels. By way of example, the conducting particles can be generally spherical, of different sizes, and be made of graphite, silica spheres coated with metal such as palladium or nickel, metal spheres such as palladium or tungsten spheres.

An interlayer 18 is formed atop the barrier layer 24. In embodiments where the x-ray detector 10 does not include an optional barrier layer 24, the interlayer 18 may be formed directly atop first electrode 20 and detector array 16. The interlayer 18 may function to nucleate or bind photoconductor 12 and to control the crystal orientation of the photoconductor 12, and as a result, improve the properties of photoconductor 12 and the performance of the x-ray detector 10. In general, the interlayer 18 is formed of molecules having a first ligand selectively binding the underlying substrate 14 or barrier layer 24 and a second ligand selectively binding a specific crystallographic face of photoconductor 12.

Figure 2:
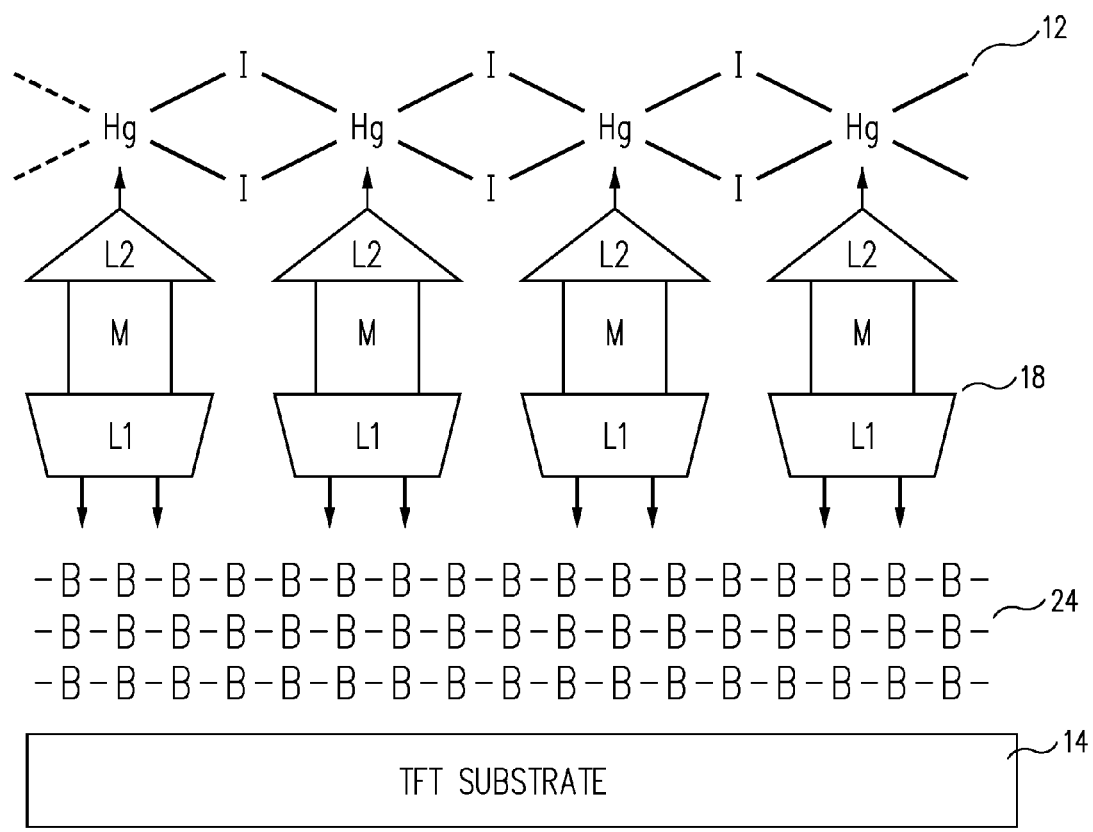
FIG. 2 schematically illustrates an exemplary interlayer binding a crystallographic face of a photoconductor and a barrier layer in accordance with one embodiment of the application.
Figure 3:
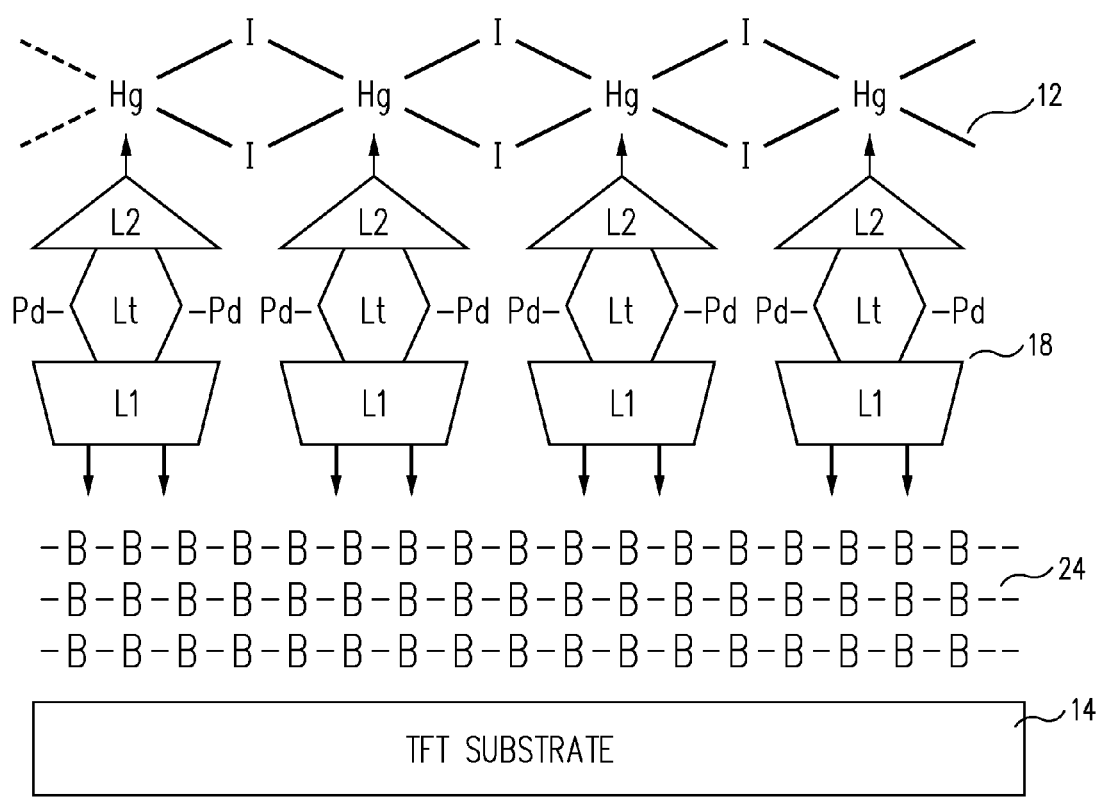
FIG. 3 schematically illustrates another exemplary interlayer binding a crystallographic face of a photoconductor and a barrier layer in accordance with one embodiment of the application.
Figure 4:
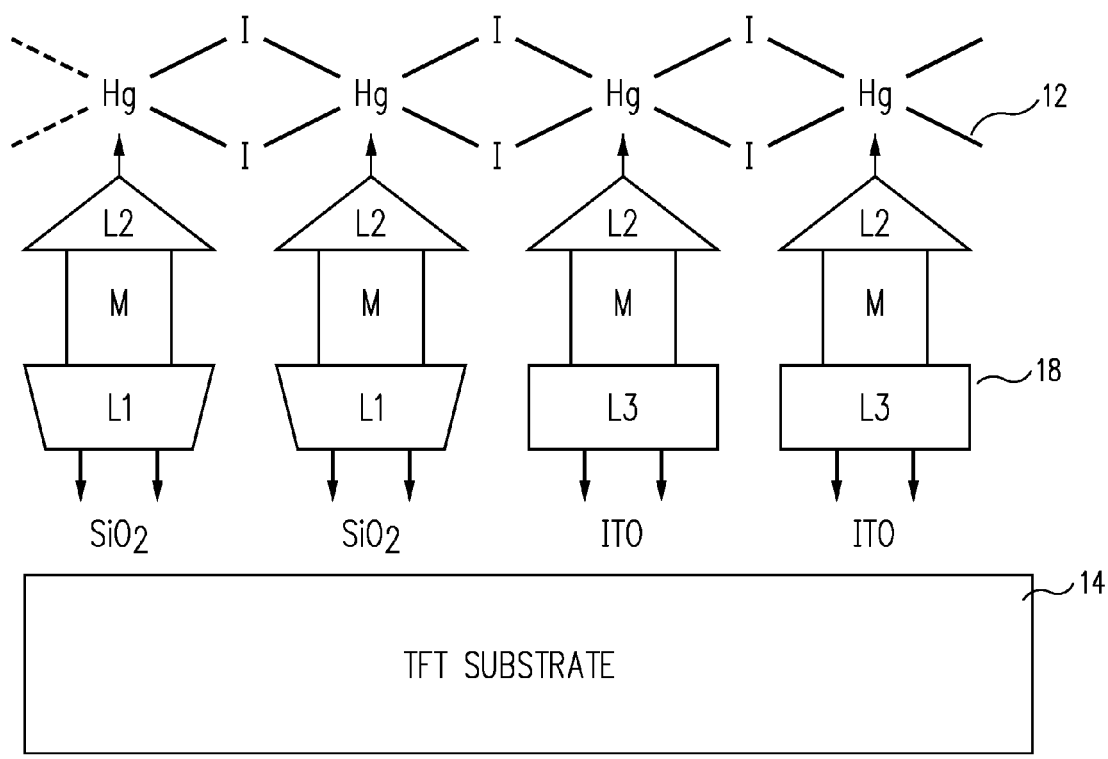
FIG. 4 schematically illustrates an exemplary interlayer binding a crystallographic face of a photoconductor and a substrate in accordance with one embodiment of the application.

FIGS. 2-4 schematically illustrate exemplary interlayers 18 that bind a specific crystallographic face of photoconductor 12 and a barrier layer 24 or underlying substrate 14. It should be pointed out that mercuric iodide is shown as photoconductor in FIGS. 2-4 for illustrative purpose. Other types of photoconductors as described in more detail below can also be used and not limited to mercuric iodide in any way.

In one embodiment shown in FIG. 2, the interlayer 18 may be formed of molecules having a general formula of $L_1$-M-$L_2$, where $L_1$ represents a first ligand that selectively binds barrier layer 24, $L_2$ represents a second ligand that selectively binds a specific crystallographic face of photoconductor 12 such as face of crystallographic $HgI_2$ (see FIG. 6), and M represents a linker between $L_1$ and $L_2$.

In one embodiment shown in FIG. 3, the interlayer 18 may be formed of molecules having a general formula of $L_1$-$L_t$-$L_2$, where $L_1$ represents a first ligand that selectively binds barrier layer 24, $L_2$ represents a second ligand that selectively binds a specific crystallographic face of photoconductor 12 such as the face of crystallographic $HgI_2$ (see FIG. 6), and $L_t$ represents a linker between $L_1$ and $L_2$. In this embodiment, $L_t$ may bind conductive particles such as palladium particles (Pd) to facilitate charge transport through the interlayer 18.

In one embodiment shown in FIG. 4, the interlayer 18 may be formed of molecules having general formulas of $L_1$-M-$L_2$ and $L_3$-M-$L_2$, and is placed between photoconductor 12 and substrate 14 without a barrier layer. In this embodiment, substrate 14 may expose two or more different substances on its surface, for example, electrode substance such as ITO and dielectric substance such as $SiO_2$ at different locations. The molecules forming the interlayer 18 may contain two or more different ligands that selectively bind different substances respectively, and thus compensating for the different materials exposed on the substrate surface. For example as shown in FIG. 4, $L_2$ represents a second ligand that selectively binds a specific crystallographic face of a photoconductor 12 such as the face of crystallographic $HgI_2$ (see FIG. 6), $L_1$ represents a first ligand that selectively binds dielectric $SiO_2$, and $L_3$ represents a third ligand that selectively binds electrode ITO. More ligands may be included in the molecules if needed for different substances exposed on the surface of the substrate 14.

The selection of ligands $L_1$, $L_2$ and/or $L_3$ is based on specific applications and depends on the materials forming the photoconductor, barrier layer and/or underlying substrate. The ligands can be peptides, poly peptide-analogs, non-peptide chemical moieties, or any combination thereof. The linker can be a bio-material, an organic molecular moiety, or a chemical moiety. In some embodiments, all ligands may be peptides. In some embodiments, one of the ligands is a peptide and the other ligand(s) is (are) a non-peptide chemical species or moiety.

Other bio-materials can be prepared for materials forming the interlayer. For example, the bio-material may include a linking moiety which may be a biological or non-biological material. Two or more ligands may be incorporated to the linking moiety for selectively binding a specific material or a specific plane of a crystallographic structure. For example, a first ligand may selectively bind a polymeric barrier film and a second ligand may specifically bind a specific crystallographic face of a photoconductor material.

Proteins can have highly specific binding sites with high ligand affinity where an ordered three-dimensional grouping of amino acids presents functional groups in a specific spatial arrangement. The binding site may exhibit enormous selectivity in the species to which it binds. Polypeptides containing only a small number of amino acids can also exhibit selective binding properties to specific surfaces.

By way of example, bacteriophage, which contains various coat proteins, can be used for materials to form the interlayer. For example, M13 bacteriophage has a long filamentous structure. By incorporating specific binding peptides into the coat protein that comprises the length of the elongated virus capsid, and proteins at the proximal and remote tips of the virus rod, the M13 bacteriophage can be modified to selectively bind a specific crystallographic face of the photoconductor and a barrier layer or underlying substrate. It is possible to replicate and sequence the peptides in the coat protein of the bacteriophage. By this exemplary means, a library of peptides which bind selectively to specific materials or specific crystal planes of individual materials can be built.

By selecting the binding ligands of the interlayer, it is possible to build a template for ordered crystal growth. For example, a mercuric iodide crystal can uniformly grow on a chemical barrier layer coated with an interlayer with the c-axis of the crystal structure normal to the plane of the film.

The photoconductor layer 12 may be deposited on top of the interlayer 18. Preferably, photoconductor layer 12 is crystallographically orientated with the highest resistivity direction aligned vertically, coinciding with the direction of bias field. In an embodiment, the photoconductor layer 12 may have a very low level of mosaicity and approximate to a slab of single crystal covering the whole TFT array, with minimal content of grain boundaries, dislocations and traps.

Photoconductor 12 can be made from any suitable material that converts x-ray photons into electrical signals. In some embodiments such as in direct conversion imaging detectors, a semiconductive material is used and operates as a photoconductor. In direct conversion detectors, x-ray photons are absorbed and electrons and holes (charge carriers) are generated directly in the semiconductive material. The electrons and holes are swept out of the semiconductive layer by an electric field generated by the first and second electrodes. The charge carriers are collected directly on capacitors at the pixels and there are no intermediate optical photons involved in the conversion process. The electrons and holes can be swept out in the direction normal to the film plane and thus can be efficiently collected at the pixel immediately below the absorption point, resulting in high sensitivity to x-rays and no inadvertent loss of resolution.

Exemplary semiconductive materials suitable for photoconductors 12 include elemental and compound semiconductors such as silicon, selenium, germanium, CdTe, CdZnTe, CdMnTe, and metal halides such as lead iodide, mercuric iodide, thallium bromide, bismuth iodide, $PbI_2$, $Bi_2Te_3$.

The high carrier mobility and low leakage current of the semiconductive layer also makes possible to build x-ray detectors in which all the charge carriers generated by the absorption of a single x-ray photon can be swept out and the quantity of charge integrated and recorded before the arrival of a subsequent photon. The ability to separate the pulses of charge from successively arriving photons enables the x-ray flux to be measured by direct photon counting and the energy content of the photons measured from the amount of charge collected per photon. By this means, the energy of the individual x-ray photons can be measured and, with appropriate binning and counting electronics, x-ray spectra can be obtained. This provides valuable additional information that is used for applications such as elemental analysis.

In some embodiments, Si, Ge or other single crystals are used in photon-counting detectors. Due to their moderate bandgaps, these materials preferably operate at liquid nitrogen temperature. In some embodiments, a cryostat is used to enclose the detector. The photon counting detectors using Si or Ge single crystals can be made small in active area and volume and not pixelated.

In some embodiments, wide-bandgap semiconductor materials with good charge transport properties and low leakage current are used as direct conversion photoconductor. Exemplary wide-bandgap semiconductors include CdTe, CdZnTe (CZT), $HgI_2$, TeBr, $BiI_3$, $PbI_2$, $Bi_2Te_3$. Wide bandgap semiconductors enable the construction of photoconductor x-ray detectors that can operate at much warmer temperatures such as at the room temperature. For example, wide-bandgap semiconductors can be used in portable hand-held x-ray detectors capable of photon counting and photon energy measurement. Such detectors can be utilized, for example, in portable x-ray fluorescence spectrometers with various applications such as in the scrap metal industry for the identification of materials. An isotope source or a small battery-powered x-ray tube provides the incident photons to excite the fluorescence.

In some embodiments, thermoelectric cooling of the wide-bandgap detector crystals to around −30° C. is employed to reduce leakage current and improve energy resolution.

In some embodiments, metal halides such as lead iodide, mercuric iodide, thallium bromide and bismuth iodide, CdTe, CZT, $PbI_2$, and $Bi_2Te_3$ are used as direct-conversion photoconductors. Heavy metal halides are wide-bandgap semiconductors and have low leakage currents at room temperature. Metal halides also have excellent x-ray absorption properties due to their high densities and high average atomic numbers. In some preferred embodiments, metal iodides such as mercuric iodide, lead iodide, $PbI_2$ are used as the photoconductor. Mercuric iodide and lead iodide have relatively high vapor pressures, and therefore, large area films of these materials can be deposited by vacuum sublimation from a source of the halide photoconductor material followed by condensation from the vapor phase onto a substrate or TFT backplane. For example, a simple vacuum chamber with a temperature-controlled substrate chuck can be employed, in a low cost process, and large area films of $HgI_2$ and $PbI_2$ can be deposited upon pixelated a-Si TFT backplanes up to 21 cm×28 cm in size.

The selective binding properties of the interlayer 18 nucleate the photoconductor 12 and control the crystal orientation and growth of the photoconductor 12 in the correct configuration. This improves the device performance, increases the production yield, and eases constraints on photoconductor growth parameters which reduces costs.

Figure 5:
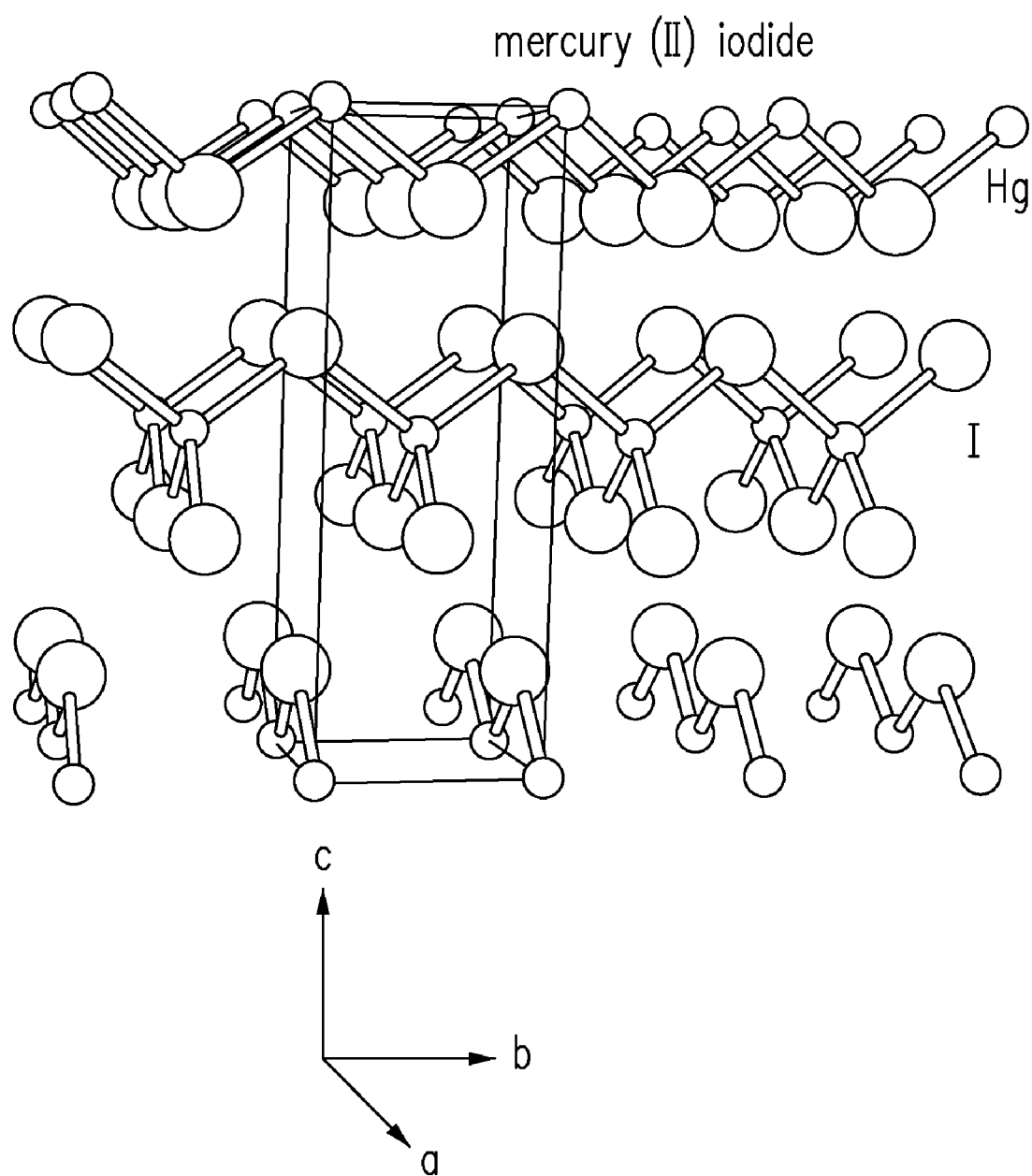
FIG. 5 illustrates a crystallographic structure of mercuric iodide showing the unit cell axes and dimensions.

For example, FIG. 5 shows a crystal structure of mercuric iodide with the unit cell axes and dimensions. In FIG. 5, mercury atoms are shown as small spheres and iodine atoms as larger spheres. Links indicate strong covalent bonds between adjacent atoms. One feature of the α-$HgI_2$ crystal structure is the arrangement of the atoms into layer planes extending in the a-b direction, with strong tetrahedral covalent bonding between mercury and iodine atoms within the layer plane. Conversely, in the c-direction there are no covalent bonds between the adjacent layer planes, which are bound together only by weak van der Waals electrostatic bonds. This layer plane structure of single crystal mercuric iodide exhibits strong anisotropy in its thermal and electrical conductivities depending upon the direction in the crystal lattice. The c-direction has the lowest thermal conductivity and the highest electrical resistivity. Therefore, in a detector using $HgI_2$ crystal as photoconductor, it is desirable to have the c-direction normal to the film plane since when a bias electric field is applied along the c-direction, it will result in the lowest leakage current or dark current.

Figure 6A:
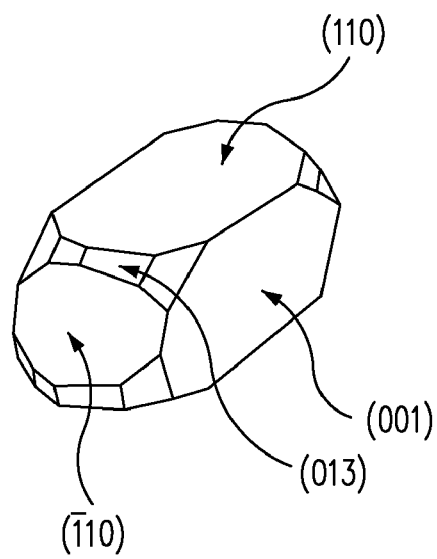
FIGS. 6a-6c illustrate crystallographic faces of mercuric iodide structure.
Figure 6B:
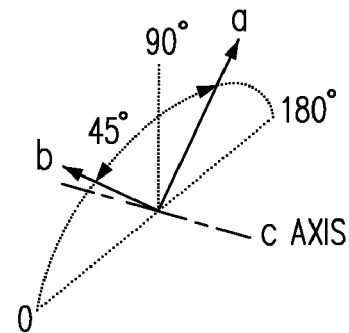
Figure 6C:
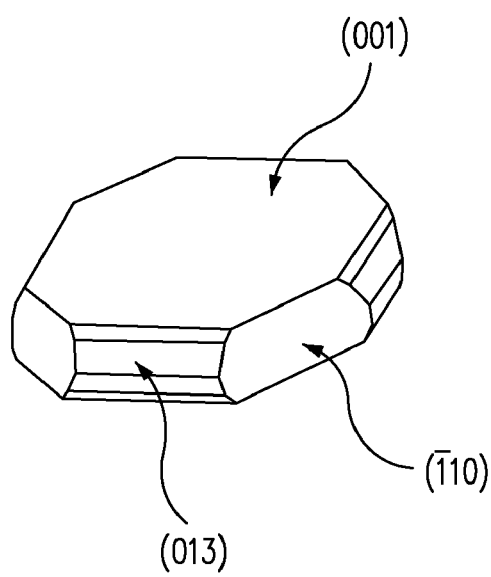

FIG. 6 illustrates two possible orientations in which mercuric iodide crystals can grow upon a surface. In one case shown in FIG. 6a, the c-axis is parallel to the substrate surface (surface (001) in FIG. 6a), with the axes delineated in FIG. 6b. In FIG. 6c, the crystal is oriented with its c-axis normal to the substrate surface (surface (001) in FIG. 6c). Small changes in substrate temperature and the substrate surface conditions can alter the thermodynamics and kinetics of film growth so as to favor the c-axis parallel growth habit rather than the c-axis normal growth orientation.

For example, the material comprising the film has a strong tendency to nucleate non-uniformly on the substrate surface (surface (001) in FIG. 6c) at the beginning of growth. Some areas of the substrate contain favorable nucleation sites and crystallites rapidly deposit on the substrate at these points. In other regions there are few favorable nucleation sites and the deposition of crystallites is sparse. For example, nucleation of $HgI_2$ onto ITO and $SiO_xN_y$ surfaces proceeds more readily than nucleation upon an organic polymer surface. However, ITO and $SiO_xN_y$ surfaces are quite variable from point to point, with randomly distributed nucleation sites. This makes the first layer of deposited material patchy, which affects the structure of the growing film.

Figure 7:
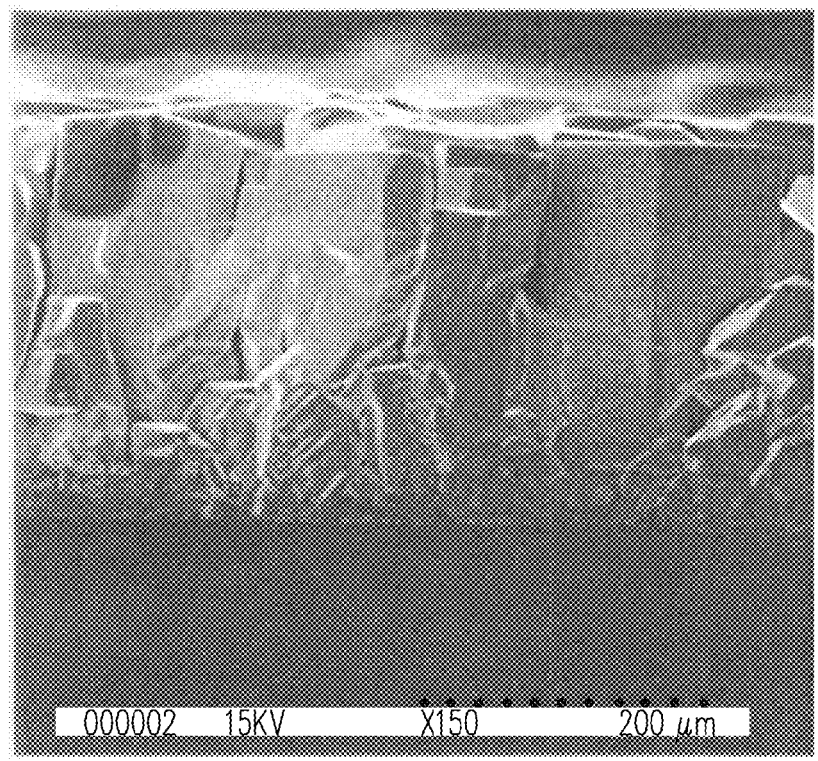
FIG. 7 illustrates a view of crystallographic structure of mercuric iodide under magnification.

Crystallites of photoconductor grow more rapidly above preferred nucleation sites and as they grow these crystallites form isolated tower-like structures (shown in FIG. 7). The result is a large number of individual crystallites within the film, separated by gaps. The top surface of the film is not planar, but instead resembles a cityscape of tower blocks divided by streets.

Figure 8:
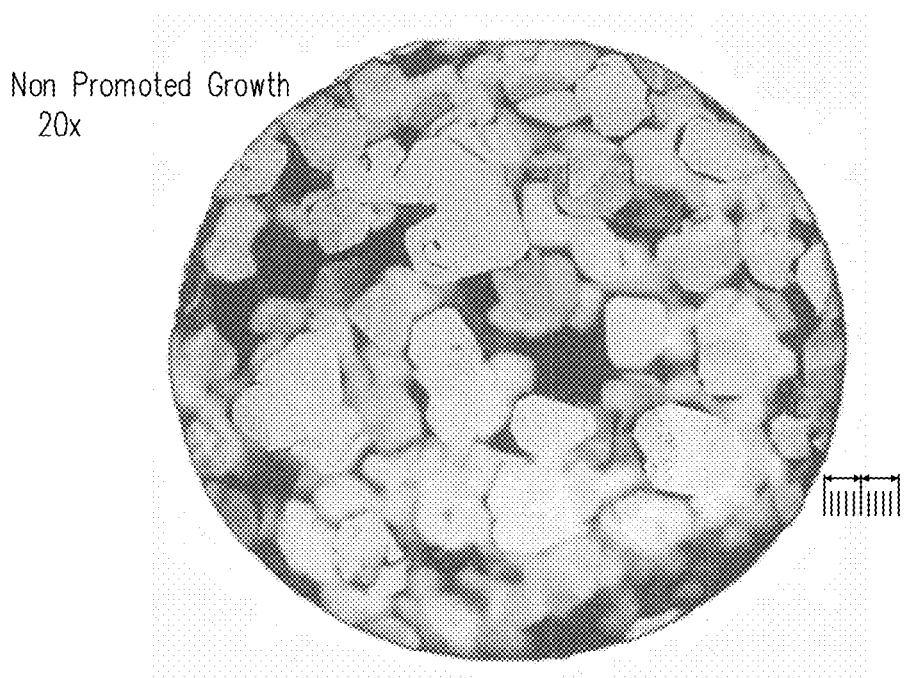
FIG. 8 illustrates another view of crystallographic structure of mercuric iodide under magnification.

Although the crystallite towers forming these films may be highly oriented in terms of the direction of their crystal axes, their blocky shapes and variable height may result in a film with a very rough top surface (shown in FIG. 8). This surface is not suitable for the deposition of a good quality top electrode, which is needed to provide the bias voltage that sweeps out the charge carriers.

If a metal film such as palladium film is sputtered onto the photoconductor film, it coats both the tops and sidewalls of the crystallite towers. If the contact metal coats the sidewalls of the crystallite "tower blocks" strong electric field enhancement can occur at the feather edges of the metal film. The high local electric field causes the injection of charge carriers into the photoconductor. This considerably increases the dark current.

If contact metal extends down the sidewalls of the crystallite "tower blocks" the electric field across the film is no longer uniform but varies from point to point. As a result, the detector will have a non-uniform response to X-rays from pixel to pixel.

The selective binding properties of the interlayer 18 nucleate photoconductor 12 and control the crystal orientation and growth of the photoconductor 12 in the correct configuration. For example, the interlayer 18 may selectively bind the crystallographic face of $HgI_2$ and nucleate $HgI_2$ on the surface of the substrate 14. $HgI_2$ crystal can then grow uniformly with the c-axis normal to the film plane. This improves the device performance, increases the production yield, and eases constraints on photoconductor growth parameters which reduces costs.

The photoconductor 12 may be deposited onto the interlayer 18 by vapor deposition such as physical vapor deposition (for example pulsed laser ablation), or by deposition from solution in aqueous or non-aqueous solvent, or by precipitation onto the selective binding surface of the interlayer layer 18 from a mixture of precursor compounds which chemically react together to form the photoconductor material in situ, such as the formation of mercuric iodide in situ: $2KI + HgCl_2 \rightarrow HgI_2 + 2KCl$.

Alternatively, already precipitated, single-crystal, micro- or nanoparticles of the photoconductor may be adsorbed onto the selective binding surface of the interlayer 18 to form a crystallographically ordered layer of close-packed particles. This layer forms an optimized, oriented, nucleation layer for the deposition of an additional thickness of the photoconductor material by a variety of other growth techniques.

Returning to FIG. 1, a second electrode 22 is deposited atop the photoconductor 12. The second electrode 22 can be made of any materials that are capable of conducting electrical current. For example, the second electrode 22 can be made from suitable materials such as silver, chromium, aluminum, gold, nickel, vanadium, zinc, palladium, platinum, carbon, etc, and alloys of these materials. Semiconductive layers such as cuprous iodide, indium tin oxide (ITO), cadmium stannate, silicon, germanium, amorphous silicon and doped versions of these semiconductors may also be used.

Various embodiments have been described exemplifying x-ray detectors but can be used in other structures or applications in addition to x-ray detectors. For instance, in the field of solar cells, silicon can be vapor deposited onto a range of different substrates at low temperature to form amorphous silicon (a-Si) films. The charge transport properties of a-Si are poor, which limit the efficiency of a-Si solar cells. At higher temperatures, increasingly crystalline silicon can be deposited, but the process conditions begin to restrict the substrate materials that may be employed. The use of an interlayer which selectively binds a specific crystal plane of silicon will increase the degree of crystallographic orientation in the deposited silicon film, and hence the transport properties and the performance of devices.

Other applications are readily apparent in a wider field of semiconductor device fabrication where a nucleation-enhancing interlayer which is highly selective both for a specific material and for a particular crystallographic orientation, can be usefully employed. Other applications include improved high temperature superconductor (HTSC) coatings on various polycrystalline substrates such as on metal tape, employing crystallographically-oriented buffer layers. An appropriately selective interfacial binding layer can be used to improve the texture of the buffer layer which in turn greatly improves the quality and performance of the (HTSC).

Other potential applications beyond semiconductors and superconductors, in areas such as hard coatings, heterogeneous catalysts, electrochemistry and high performance batteries, will be readily apparent to one of ordinary skill in the art.

From the foregoing it will be appreciated that, although specific embodiments of the application have been described herein for purposes of illustration, various modifications may be made without deviating from the spirit and scope of the application.

What is claimed is:

1. An image acquisition device comprising:
   a photoconductor;
   a substrate having a surface;
   a detector array deposited above the surface of the substrate; and
   an interlayer between the photoconductor and the substrate, wherein the interlayer is formed of molecules having a first ligand and a second ligand.

2. The image acquisition device of claim 1 wherein the photoconductor is made of a semiconductive material capable of converting photons to electrons and holes.

3. The image acquisition device of claim 2 wherein the semiconductive material has a crystallographic structure and the second ligand selectively binds a specific crystallographic face of the structure.

4. The image acquisition device of claim 2 wherein the semiconductive material comprises a metal halide.

5. The image acquisition device of claim 4 wherein the metal halide comprises at least one of mercuric iodide, lead iodide, thallium bromide, bismuth iodide, PbI2, Bi2Te3, CdTe, or CZT.

6. The image acquisition device claim 5 wherein the metal halide comprises mercuric iodide.

7. The image acquisition device of claim 6 wherein the second ligand selectively binds a selective face of the crystallographic mercuric iodide.

8. The image acquisition of device of claim 1 wherein the first ligand selectively binds the substrate and the second ligand selectively binds the photoconductor.

9. The image acquisition device of claim 1 wherein the first ligand and the second ligand are each individually selected from the group consisting of protein, polypeptides, poly peptide-analogs, chemical moieties, and any combination thereof.

10. The image acquisition device of claim 1 wherein the molecules further comprises a linker linking the first ligand and the second ligand.

11. The image acquisition device of claim 10 wherein the linker selectively binds a conducting material.

12. The image acquisition device of claim 1 wherein the interlayer comprises a protein, polypeptide, poly peptide-analogs, chemical moieties, or any combination thereof.

13. The image acquisition device of claim 1 wherein the interlayer comprises a bacteriophage, or modified bacteriophage.

14. The image acquisition device of claim 1 wherein the substrate is formed of a non-biological material.

15. The image acquisition device of claim 1 wherein the first ligand comprises two or more binding sites selectively bind two or more different substances exposed on the substance substrate.

16. The image acquisition device of claim 1 further comprising a barrier layer above the substrate and the first ligand binds the barrier layer.

17. The image acquisition device of claim 16 wherein the barrier layer comprises an insulator including conducting particles embedded therein.

18. The image acquisition device of claim 1 wherein the molecules further comprise a third ligand.

19. The image acquisition device of claim 18 wherein the molecules comprise the first ligand and the third ligand to selectively bind two or more different substances exposed on the substrate.

20. An image acquisition device comprising:
   a photoconductor formed of a crystallographic semiconductive material capable of converting photons to electrons and holes;
   a substrate formed of a non-biomaterial and a detector array; and
   an interlayer between the photoconductor and the substrate, wherein the interlayer is formed of molecules having a first ligand and a second ligand.

21. The image acquisition device of claim 20 wherein the first ligand selectively binding the substrate and the second ligand selectively binding a specific crystallographic face of the semiconductive material.

22. The image acquisition device of claim 21 wherein the second ligand selectively binds a specific crystallographic face that has an axis substantially parallel to a direction of highest electrical resistivity of the semiconductive material.

23. The image acquisition device of claim 21 wherein the semiconductive material is mercuric iodide and the specific crystallographic face is the face of crystallographic mercuric iodide.

24. The image acquisition device of claim 20 wherein the molecules comprise a linker linking the first ligand and the second ligand and the linker selectively binds a conducting material.

25. The image acquisition device of claim 20 further comprising a barrier layer atop the substrate and the first ligand selectively binds the barrier layer.

26. The image acquisition device of claim 20 wherein the first ligand comprises two or more binding sites that selectively binds two or more different substances exposed on the substrate.

27. The image acquisition device of claim 20 wherein the molecules further comprise a third ligand.

28. The image acquisition device of claim 27 wherein the molecules comprise the first ligand and the third ligand to selectively bind two or more different substances exposed on the substrate.

29. A structure comprising:
a substrate formed of a first material; and
a layer formed of molecules having a first ligand selectively binding the first material, a second ligand selectively binding a second material, and a linker linking the first ligand and the second ligand;
wherein the second material is a semiconductive material having a crystallographic structure and the second ligand selectively binds a specific face of the crystallographic structure.

30. The structure of claim 29 wherein the semiconductive material is mercuric iodide and the second ligand selectively binds crystallographic face of mercuric iodide.

31. The structure of claim 29 wherein the second material is a crystallographic silicon.

32. The structure of claim 29 wherein the first material comprises a metal, a semiconductor, a polycrystalline silicon, or any combination thereof.

33. A structure comprising:
a substrate layer formed of a first material; and
a template layer above the substrate layer formed of template molecules for ordered inorganic crystal growth;
wherein the template molecule comprises a first ligand selectively binding the first material, a second ligand selectively binding a second material, and a linker linking the first ligand and the second ligand.

34. The structure of claim 33 further comprises a layer of inorganic crystal atop of the template layer.

35. The structure of claim 33 wherein the second material is an inorganic crystal and the second ligand selectively binds a specific face of the crystallographic structure of the inorganic crystal.

36. The structure of claim 35 wherein the inorganic crystal is a metal halide.

37. The structure of claim 36 wherein the metal halide comprises mercuric iodide, lead iodide, thallium bromide, bismuth iodide, PbI2, Bi2Te3, CdTe, or CZT.

38. The structure of claim 33 wherein the template molecule comprises proteins, polypeptides, poly peptide-analogs, chemical moieties, or any combination thereof.

* * * * *

UNITED STATES PATENT AND TRADEMARK OFFICE
CERTIFICATE OF CORRECTION

PATENT NO. : 7,700,923 B2
APPLICATION NO. : 12/234647
DATED : April 20, 2010
INVENTOR(S) : Green et al.

Page 1 of 1

It is certified that error appears in the above-identified patent and that said Letters Patent is hereby corrected as shown below:

IN THE SPECIFICATION:

Column 1, line 26, replace "ND" with -- A/D --.

Column 3, line 67, replace "CODs" with -- CCDs --.

IN THE CLAIMS:

Claim 15, column 10, lines 45-46, delete "substance".

Signed and Sealed this

Eighth Day of June, 2010

David J. Kappos
*Director of the United States Patent and Trademark Office*